(12) United States Patent
Ting et al.

(10) Patent No.: US 6,187,152 B1
(45) Date of Patent: *Feb. 13, 2001

(54) MULTIPLE STATION PROCESSING CHAMBER AND METHOD FOR DEPOSITING AND/OR REMOVING MATERIAL ON A SUBSTRATE

(75) Inventors: Chiu H. Ting, Saratoga; William H. Holtkamp, San Jose, both of CA (US)

(73) Assignee: Cutek Research, Inc., San Jose, CA (US)

( * ) Notice: Under 35 U.S.C. 154(b), the term of this patent shall be extended for 0 days.

This patent is subject to a terminal disclaimer.

(21) Appl. No.: 09/118,664

(22) Filed: Jul. 17, 1998

(51) Int. Cl.[7] .............................. C25D 17/00; C25B 9/00; B05C 3/00; B05C 3/02

(52) U.S. Cl. .............................. 204/224 R; 204/224 M; 204/269; 204/273; 204/275.1; 118/412; 118/423; 118/715

(58) Field of Search ........................... 204/198, 224 R, 204/224 M, 212, 222, 225, 267, 273, 269; 118/407, 423, 715, 412

(56) References Cited

U.S. PATENT DOCUMENTS

| | | | |
|---|---|---|---|
| 4,883,575 | * 11/1989 | Yasuno et al. | 204/198 |
| 5,000,827 | 3/1991 | Schuster et al. . | |
| 5,024,746 | 6/1991 | Stierman et al. . | |
| 5,092,975 | * 3/1992 | Yamamura et al. | 204/198 |
| 5,256,274 | 10/1993 | Poris . | |
| 5,316,642 | * 5/1994 | Young, Jr. et al | 204/198 |
| 5,368,711 | 11/1994 | Poris . | |
| 5,429,733 | 7/1995 | Ishida . | |
| 5,437,777 | 8/1995 | Kishi . | |
| 5,441,629 | 8/1995 | Kosaki . | |

(List continued on next page.)

OTHER PUBLICATIONS

Contolini, R., et al., A Copper Via Plug Process by Electrochemical Planarization, 1993 VMIC Conference–102/93/0470, Jun. 8–9, 1993, pp. 470–477.

Pai, Pei–Lin & Ting, Chiu, Copper as the Future Interconnection Material, 1989 VMIC Conference, TH–0259–2/89/0000–0258, Jun. 12–13, 1989, pp. 258–264.

Contolini, R., et al., Copper Electroplating Process for Sub–Half–Micron ULSI Structure, 1995 VMIC Conference –104/95/0322, Jun. 27–29, 1995 pp. 322–328.

Ting, Chiu H., et al., Recent Advances in Cu Metallization, 1996 VMIC Conference, 106/96/0481(c), Jun. 18–20, 1996, pp. 481–486.

Contolini, Robert J., et al., Electrochemical Planarization for Multilevel Metallization, J. Electrochem. Soc., vol. 141, No. 9, Sep. 1994, pp. 2503–2510.

Equinox –Single Substrate Processing System, A Semitool Brochure, EQU025–4/94, pp. 1.8–8.8.

Primary Examiner—Donald R. Valentine
(74) Attorney, Agent, or Firm—Blakely Sokoloff Taylor & Zafman

(57) ABSTRACT

A multiple station processing chamber used to deposit and/or remove a material on a semiconductor wafer is described. The multiple station processing chamber is comprised of two or more processing stations at which the wafer is exposed to a processing fluid. The processing stations are positioned within the chamber such that the wafer may be moved from station to station while remaining within the chamber. Each station of the multiple station processing chamber may have a fluid containment ring used for containment, disposal, and/or reuse of the electrolyte used to process the wafer at that particular processing station. The wafer is brought to the first processing station on a wafer support and exposed to a first processing fluid, which is then diverted into fluid containment ring for the first processing station. The wafer is then moved to a second processing chamber where the process is repeated with a second processing fluid.

22 Claims, 11 Drawing Sheets

U.S. PATENT DOCUMENTS 5,447,615    9/1995    Ishida .
5,516,414    5/1996    Glafenhein et al. .
5,750,014  * 5/1998    Stadler et al.  ............... 204/224 R X
5,830,805   11/1998    Shacham-Diamand et al. .
5,853,559   12/1998    Tamaki et al. .
6,017,437  * 1/2000    Ting et al.  ...................... 204/224 R

* cited by examiner

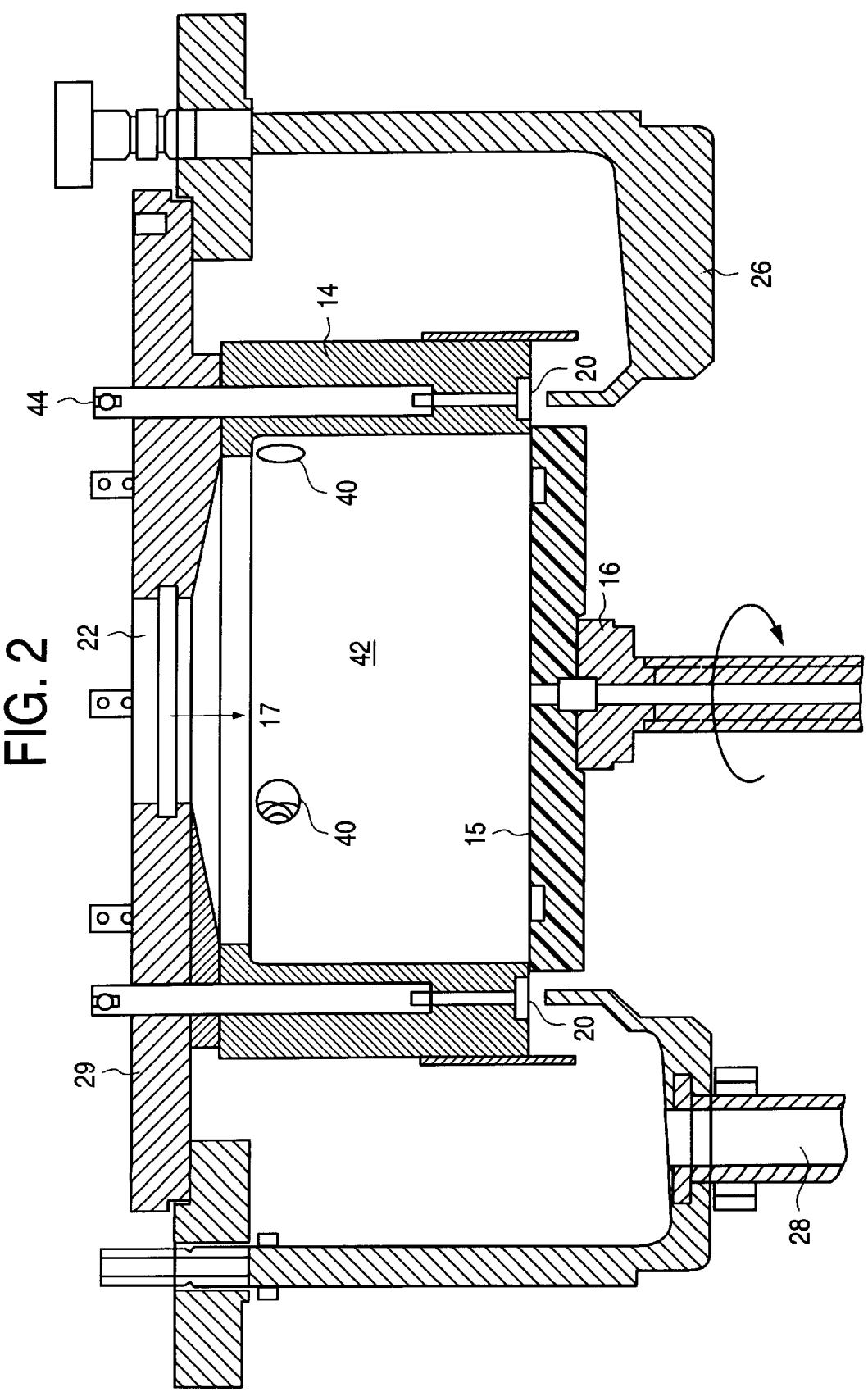

MULTIPLE STATION PROCESSING CHAMBER AND METHOD FOR DEPOSITING AND/OR REMOVING MATERIAL ON A SUBSTRATE

BACKGROUND OF THE INVENTION

1. Field of the Invention

The present invention relates to the field of semiconductor wafer processing and, more particularly, to a multiple station processing chamber for depositing and/or removing a material on a semiconductor wafer.

2. Related Applications

The present invention is related to the U.S. Patent Applications entitled "Process Chamber and Method for Depositing and/or Removing Material on a Substrate,"Ser. No. 08/916,564, filed Aug. 22, 1997, U.S. Pat. No. 6,017,437 incorporated herein by reference, and "Method and Apparatus for the Disposal of Processing Fluid Used to Deposit and/or Remove Material on a Substrate", Ser. No. 09/118,362, filed Jul. 17, 1998.

3. Description of the Related Art

In the manufacture of devices on a semiconductor wafer, it is the practice to fabricate multiple levels of conductive (typically metal) layers above a substrate. The multiple metallization layers are employed in order to accommodate higher densities as device dimensions shrink well below one-micron design rules. Likewise, the size of interconnect structures also need to shrink in order to accommodate the smaller dimensions. Thus, as integrated circuit technology advances into the sub- 0.25 micron range, more advanced metallization techniques are needed to provide improvements over existing methods of practice.

One approach has been to utilize copper as the material for some or all of the metallization of a semiconductor wafer (see for example, "Copper As The Future Interconnection Material;" Pei-Lin Pai et al.; Jun 12–13, 1989 VMIC Conference; pp. 258–264). Since copper has a better electromigration property and lower resistivity than aluminum, it is a more preferred material for providing metallization on a wafer than aluminum. In addition, copper has improved electrical properties over tungsten, making copper a desirable metal for use as plugs (inter-level interconnect) as well. However, one serious disadvantage of using copper metallization is that it is difficult to deposit/etch. It is also more costly to implement than aluminum. Thus, although enhanced wafer processing techniques are achieved by copper, the potential cost associated with copper processing is a negative factor. Accordingly, it is desirable to implement copper technology, but without the associated increase in the cost of the equipment for copper processing.

In order to fabricate features, circuits, and devices on a substrate, such as a semiconductor wafer, various techniques are known to deposit and etch materials on the wafer. Deposition techniques include processes such as physical vapor deposition (PVD), chemical vapor deposition (CVD), sputtering, and immersion of the wafer in an electrolyte. This last technique can be used for either electroless deposition or for electroplating. In an electroplating technique, the substrate is immersed in an electrolyte (or processing fluid) and positioned in an electric field between a cathode and an anode such that charged particles are deposited onto the surface of the wafer. (See for example, U.S. Pat. No. 5,441,629, which is titled "Apparatus and Method of Electroplating.")

Similarly, a number of techniques are known for removing a material from a wafer. These techniques include reactive ion etching (RIE), plasma etching, chemical-mechanical polishing (CMP), and immersion of the wafer in an electrolyte. Material removal by subjecting an immersed wafer to an electric field employs an equivalent setup to that used for electroplating, but with an opposite result, since charged particles are removed from the wafer in this instance.

Various processing chambers have been used in which a substrate, such as a semiconductor wafer, is exposed to an electrolyte (or processing fluid) for processing. The chamber has then been emptied through openings along the sides of the chamber and/or through a drain at the base of the chamber. As the electrolyte is drained from the processing chamber, however, the unprocessed side (the back) of the wafer is often exposed to the electrolyte. It would be advantageous if an electrolyte could be drained from the processing chamber into a separate fluid containment ring for storage, disposal, and/or recycling without exposing the back of the wafer to the electrolyte.

When using a processing chamber, it is generally preferred that the chamber be completely emptied, rinsed, and often dried before each subsequent injection of an electrolyte into the chamber housing the wafer for processing. Additionally, in order to be able to store and/or reuse/recycle each electrolyte, the overflow openings, the outer sides of the chamber, and the drain must each be completely emptied, rinsed, and usually dried to prevent the exposure and/or contamination of each subsequent electrolyte with the previous electrolyte(s) used to process the wafer. The features required to clean the chamber before and after each electrolyte is injected and later drained from the chamber are an added cost in the manufacturing of the chamber and in the actual processing of the wafer. Further, it is difficult to completely remove all traces of an electrolyte from the drain and chamber exterior, and thus some contamination of the electrolyte(s) is highly likely.

The processing chamber used to deposit and/or remove material on a wafer may be sealed to allow the process to occur in a vacuum, at a given pressure or temperature, or at clean room conditions. However, when moving the wafer between processing chambers, the wafer is often exposed to the ambient conditions external to the processing chamber. Thus, it would be advantageous to have a processing chamber in which multiple processes could be applied to a wafer within a single sealed chamber.

The present invention employs a method and apparatus for multiple step processing of a substrate through use of a multiple station processing chamber. Each processing step (or each processing step involving a different electrolyte) has its own processing station in which a particular electrolyte is applied to the wafer. The separate stations eliminate the need for the repeated rinsing and drying required of a single processing chamber before application of each subsequent electrolyte. Further, since each processing station has a separate draining system, each electrolyte may be recycled and reused without contamination by traces of other electrolytes. Recycling and reuse of the electrolytes greatly reduces the liquid volume usage requirements of processing a wafer.

SUMMARY OF THE INVENTION

The present invention describes a multiple station processing chamber used to deposit and/or remove a material on a semiconductor wafer. The multiple station processing chamber is comprised of two or more processing stations at which the wafer is exposed to a processing fluid. The processing stations are positioned within the chamber such that the wafer may be moved from station to station. Each station of the multiple station processing chamber may have a fluid containment ring used for containment, disposal, and/or reuse of the electrolyte used to process the wafer at that particular processing station. The wafer is raised on a wafer support to the first processing station where it is exposed to a first processing fluid, which is then diverted into a first fluid containment ring. The wafer is then lowered on the wafer support to a second processing station where the wafer is exposed to a second processing fluid, which is then diverted into a second fluid containment ring. This continues until all processing steps have been completed.

A processing chamber using multiple processing stations provides an apparatus and method that eliminates the need for repeated rinsing and drying of a processing chamber and draining system before application of each subsequent processing fluid. Further, since each processing fluid has a separate draining system, each processing fluid may be more easily recycled and reused without contamination by traces of previous processing fluids used in the chamber. Recirculation and reuse of the processing fluids greatly reduces the liquid volume usage requirements of processing a wafer.

DESCRIPTION OF THE DRAWINGS

FIG. 2 is a cross-sectional view of an inner fluid sleeve and fluid containment ring of the present invention with the wafer support raised such that the wafer is engaged with the lower end of the inner sleeve to form a containment chamber.

DETAILED DESCRIPTION OF THE INVENTION

Figure 1:
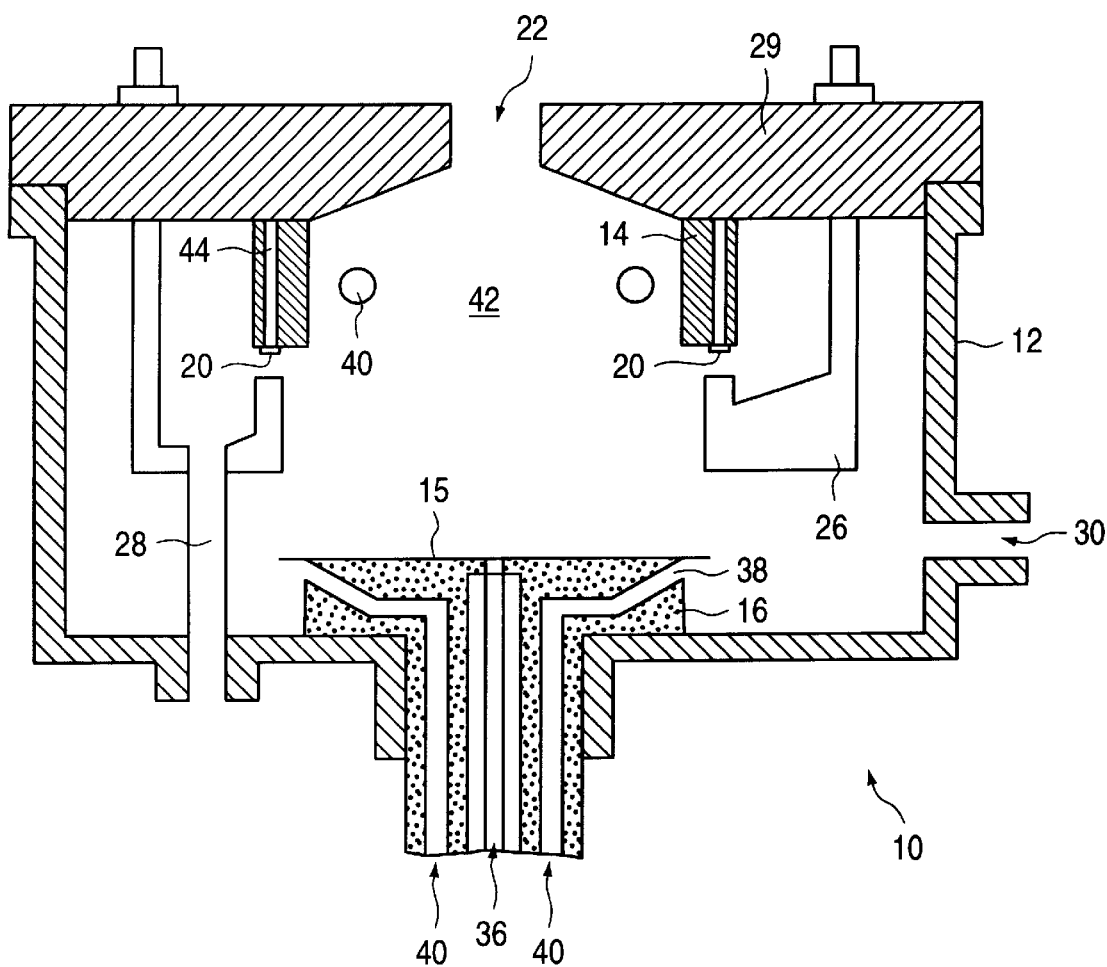
FIG. 1 is a cross-sectional view of a processing chamber and fluid containment ring of the present invention with the wafer support positioned to receive or remove a wafer through the access port.

A multiple station processing chamber for use in depositing and/or removing a material on a semiconductor wafer by subjecting the wafer to an electric field and a processing fluid is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well-known techniques and structures have not been described in detail in order not to obscure the present invention.

It is to be noted that a preferred embodiment of the present invention is first described in reference to the deposition of a metal material by a technique of electroplating the material onto a semiconductor wafer. The preferred material for the described deposition is copper. However, it is appreciated that the present invention can be readily adapted to the deposition of other metals and alloys (hereinafter, the term metal includes metal alloys) and dielectric materials as well. Furthermore, the present invention need not be limited strictly to semiconductor wafers. The invention can be readily adapted to processing materials on other substrates, including substrates utilized for packaging semiconductor devices, such as bump formation or ceramic substrates, and the manufacturing of flat panel displays.

Additionally, alternative embodiments are described in which the chamber of the present invention can be utilized to electropolish materials from similar substrates. For ease of description, etching, polishing, deplating, or otherwise removing material as practiced herein are all collectively referred to as electropolishing or polishing, in which an electrolyte and an electric field are utilized for material removal. With electropolishing, different electrolytes would be required than those used in electroplating, and the direction of the applied potential (voltage) in the chamber would be reversed for performing the material removing operation. However, the chamber structure described herein for depositing a material can be readily adapted for removing a particular material from a semiconductor wafer or other substrate.

The present invention describes a multiple station processing chamber used to deposit and/or remove a material on a semiconductor wafer. The multiple station processing chamber is comprised of two or more processing stations at which the wafer is exposed to a processing fluid. The processing stations are positioned within the chamber such that the wafer may be moved from station to station while remaining within the chamber. Since multiple processing steps occur within a single chamber, the wafer is not exposed to ambient conditions while being moved from process to process. Instead, the wafer remains at the desired pressure, temperature, etc. required for optimum results in processing the wafer. Further, because each processing fluid is applied at a different processing station, each processing fluid may be recycled and reused without contamination by traces of other processing fluids.

The type of processing stations used within the multiple processing chamber may vary, depending on the desired number of stations, the processing fluids to be applied at each processing station, etc. Each processing station may be independent of the others, having its own respective inlet for applying the processing fluid of that station and its own draining system for disposal or recirculation of the processing fluid after processing (the used processing fluid). One method for applying a processing fluid and then disposing of the used (spent) processing fluid via a fluid containment ring is described below in the context of a single processing chamber. The single processing chamber described below may then be modified to allow multiple stations to be positioned in a stacked row or multiple stacked rows within a single containment chamber, thus forming a multiple station processing chamber.

Single Processing Chamber with Fluid Containment Ring

A processing chamber may be used for depositing and/or removing material onto/from a semiconductor wafer, wherein the wafer is subjected to a processing fluid and an electric field within the chamber. A fluid containment ring may be positionally coupled to the chamber to dispose of the processing fluid after the fluid has processed the wafer. The fluid containment ring may then store, dispose of, or recycle the used processing fluid. The fluid containment ring may be used with a variety of processing chambers and/or adapted for use on existing chambers. The fluid containment ring may also be used with the chamber described in the U.S. Patent Application entitled "Process Chamber and Method for Depositing and/or Removing Material on a Substrate", Ser. No. 08/916,564, filed Aug. 22, 1997, now U.S. Pat. No. 6,017,437, assigned to the Assignees of the present invention, and which is incorporated herein by reference.

Referring to FIGS. 1 and 2, a cross-sectional view of a processing chamber 10 with fluid containment ring 26 of the present invention is shown. The chamber 10 includes an outer casing 12 (note that in FIG. 2 the outer casing 12 is not shown), an inner fluid sleeve 14, a wafer support (also referred to as a wafer platen, platform, or pedestal) 16, an anode electrode (not shown), cathode electrodes 20, a fluid delivery and anode shaft/opening 22, and a fluid containment ring 26.

Loading the Wafer into the Chamber

As shown in FIG. 1, the support 16 is positioned to receive or remove a wafer through the access port 30. This is the transfer entry (receiving) position for the wafer. The wafer is inserted through the access port 30, which provides the interface between the interior of the chamber 10 and the environment external to it. Utilizing one of a variety of wafer handling tools, such as a robot arm (not shown), the wafer 15 is loaded into the chamber 10 through the access port 30 to be positioned over the support 16. The support 16 rises to engage or accept the wafer 15 onto the support 16. The loading mechanism withdraws, and the support 16 rises until the wafer 15 engages the sleeve 14. Processing of the wafer 15 typically occurs while the wafer 15 is engaged with the sleeve 14. Note that dry in/dry out processes comprised of a rinsing, spinning, and drying step are typically applied at a position lowered from the bottom of the sleeve 14. Additionally, processing at an alternate station position may be done without any sleeve 14.

When the processing is complete and the wafer 15 is to be removed from the chamber 10, the support 16 is positioned at a transfer exit position for removing the wafer 15 from the chamber 10. The wafer handler mechanism is reinserted through port 30 and extracts the wafer 15 through the port opening 30. The transfer entry and exit positions may or may not be the same position, depending on the optimum handling method employed when integrated with a wafer handler mechanism.

Wafer Support

Figure 3A:
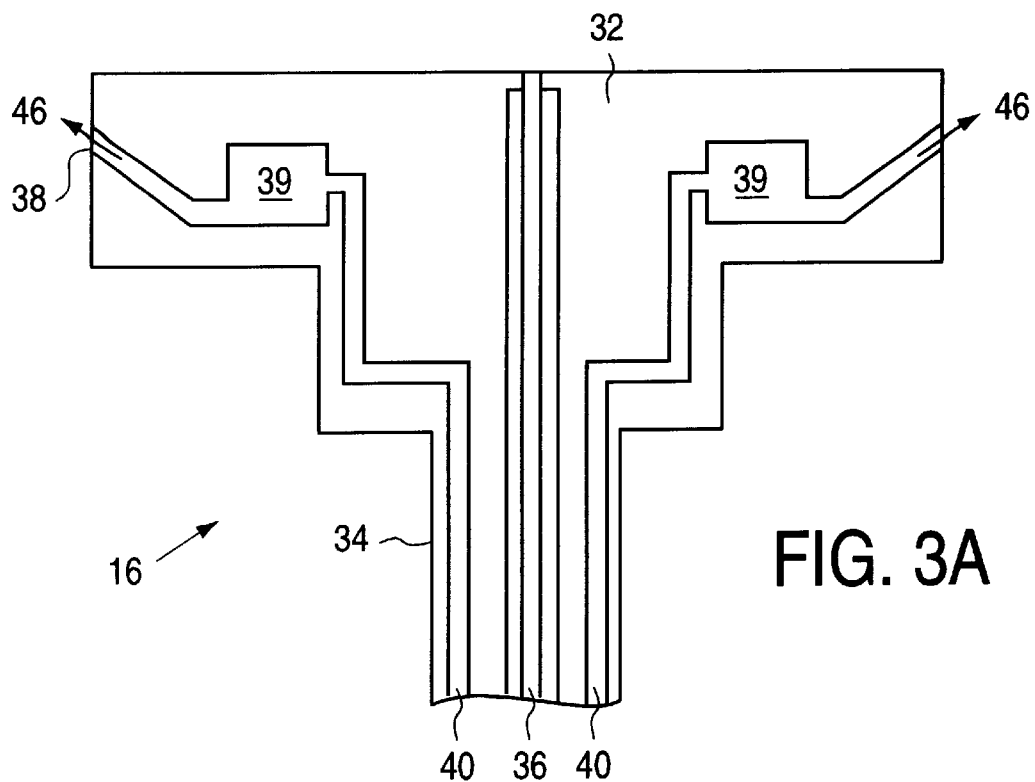
FIG. 3A is a cross-sectional view of a first embodiment of a wafer support used in the processing chamber of the present invention.
Figure 3B:
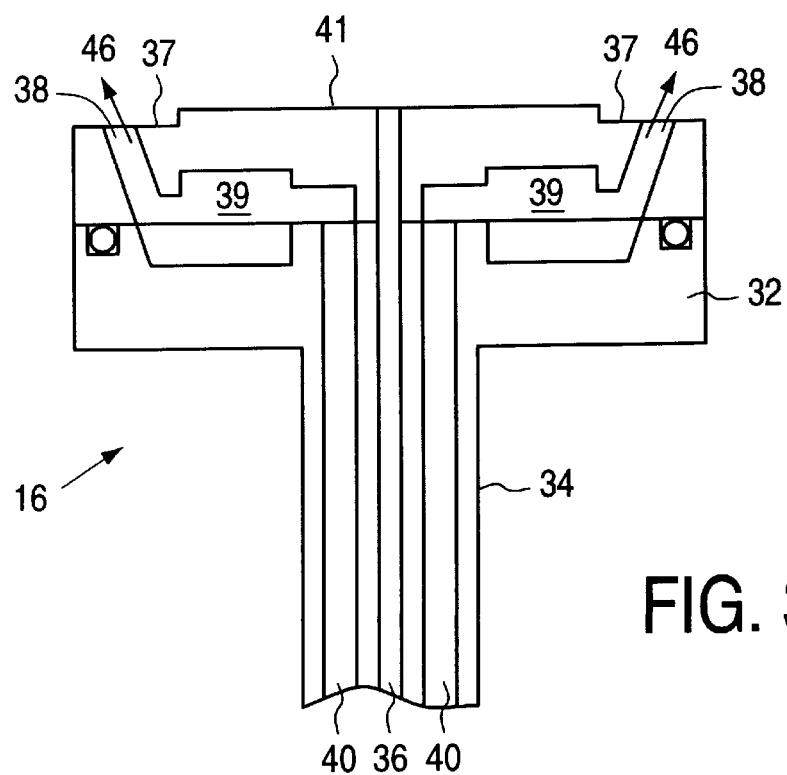
FIG. 3B is a cross-sectional view of a second embodiment of a wafer support used in the processing chamber of the present invention.

After the wafer 15 is inserted into the chamber 10 through the access port 30, the wafer 15 is placed on the upper surface of the wafer support 16. A cross-sectional view of alternate embodiments of the wafer support 16 are shown in FIGS. 3A and 3B, with FIG. 3B depicting the preferred embodiment. The wafer support 16 is typically shaped as a flat circular disk to accommodate a flat circular semiconductor, such as a silicon wafer. The wafer support 16 has an upper section assembly 32 and a lower section assembly 34 that extends through the casing 12 (see FIG. 1). The upper section assembly 32 receives the wafer thereon and the lower section assembly 34 forms the shaft of the wafer support 16. The lower section assembly 34 provides for the mechanical motion of the wafer support 16, and can be coupled to a rotary driving means, such as a motor, to provide the rotational movement for turning the support 16.

The lower section assembly 34 further consists of a channel 36 for providing a vacuum extending from the lower section assembly 34 up through the upper section assembly 32. At the surface of the upper section assembly 32 of the support 16, a number of small vacuum openings (not shown) are present. A vacuum is applied through the channel 36 to the surface of the support 16 when the wafer is disposed thereon to hold the wafer in place.

Angled holes or slots 38 are located in the upper section assembly 32 of the support 16 and are coupled to a gas purge line 40 disposed within the lower section assembly 34 of the support 16. The angled holes or slots 38 are positioned within the upper section assembly 32 of the wafer support 16 such that they direct a gas flow 46 to the back surface (the unprocessed surface) of the wafer. Note that in FIG. 3A the angled holes or slots 38 are located on the sides of the upper section assembly 32 of the wafer support 16, and will direct the gas flow 46 along the outer bottom edge of the wafer that extends past the outer edges of the upper section assembly 32. A second and more preferred embodiment of the wafer support 16 is depicted in FIG. 3B. In FIG. 3B, the angled holes or slots are located on the slightly lowered surface 37 located around the periphery of the top surface 41 of upper section assembly 32. The lowered surface 37 is typically 0.005 in. below the surface 41 of the upper section assembly 32. By placing the angled holes or slots 38 on the top surface of the upper section assembly 32, the second embodiment of the wafer support 16 allows a gas flow 46 to direct the used processing fluid into the fluid containment ring whether a wafer extends past the outside edge of the upper section assembly 32 or is smaller than the upper section assembly 32.

The gas flow 46 directed by the angled holes or slots 38 diverts the used processing fluid into the fluid containment ring and prevents any processing fluid from flowing off the edges of the wafer and encountering the back (or unprocessed) surface of the wafer. An expansion chamber 39 may be located in the upper section assembly 32 of the wafer support 16 along the gas purge line 40. The expansion chamber 39 can be used to lower the pressure of the gas delivered to the back side of the wafer and equalize the gas flow since the gas delivered to the gas flow line 40 is typically at a high pressure. In the preferred embodiment of the present invention, the gas purge line 40 will deliver a constant supply of nitrogen ($N_2$) gas to the angled holes or slots 38. Many other gases, such as helium, argon, clean dry air (CDA), etc., may also be used in the gas flow 36.

Containment Chamber

Returning to FIGS. 1 and 2, once the wafer 15 is placed on the wafer support 16 and securely disposed thereon, the wafer support 16 raises the wafer 15 until the wafer 15 engages the inner fluid sleeve 14. In FIG. 2 the wafer support 16 is shown in the up (or engaged) position. In the engaged position, the wafer support 16 with the wafer 15 residing thereon, is made to engage the sleeve 14. Although a variety of techniques are available to engage the two components 14 and 16, in the preferred embodiment, the wafer support 16 is made movable in the vertical direction. When in position, the wafer 15 resides at the bottom of the sleeve 14 to form the floor for the sleeve 14 so that the face of the wafer 15 is exposed to the electrolyte residing within the sleeve 14. It should be noted that only the outer edge portion of the wafer, which is usually left unprocessed, mates with the sleeve 14.

The size and shape of the sleeve 14 is a design choice depending on the shape of the substrate to be processed, but generally the shape is cylindrical to provide a containment wall to conform to the shape of a circular wafer. The inner fluid sleeve 14 (also referred to as a fluid containment vessel or inner processing chamber) is shaped as a hollow cylinder that is open at both ends. The lower end of the sleeve 14 mates to a wafer 15 residing on the support 16 such that the interior of sleeve 14 forms a primary containment region 42 for the holding (containing) of the electrolyte. The upper opening of the sleeve 14 mates to the casing cover 29.

For a given process, it is important that a predetermined level of processing fluid be maintained. FIG. 2 illustrates a preferred method of maintaining the fluid level, showing at least one opening 40 disposed along the cylindrical sidewall of the sleeve 14. The size and the actual number of such opening(s) are a design choice. The openings 40 function as fluid discharge (or overflow) openings for the fluid in the sleeve 14. Thus, the height of such openings 40 along the sleeve 14 will be determined by the desired height of the processing fluid filling the sleeve 14. It is understood that the same result may be obtained by installing one or more overflow tubes inside sleeve 14 that exit to a contained discharge, whether that discharge is the fluid containment ring 26 or a separate discharge.

The sleeve 14 may also contain multiple contact locations, which are associated with the placement of the cathode electrodes 20 on the face of the wafer 15. Correspondingly disposed at the contact locations and within the wall of the sleeve 14 are hollow openings (or channels) 44. The channels 44 are utilized to couple electrical connections to the cathodes 20 located at the bottom of the sleeve 14. The channels 44 allow the placement of electrical connections to the wafer surface, but shield the electrical connections from the corrosive effects of the electrolyte. The cathodes 20 are an elongated electrical conductor and are typically bent or spring-loaded downward at one end to make contact with the edge of the wafer 15. Each cathode 20 is affixed to the bottom surface of the sleeve 14 by coupling it to an electrical conductor housed within the channels 44. Thus, when the sleeve 14 is assembled and placed within the chamber 10, each cathode 20 is attached to its corresponding electrical conductor at one end with the opposite end making contact with the edge of the wafer 15. The cathodes 20 together form a distributed cathode with contacts to the face-side of the wafer 15 that will undergo the electroplating process.

The upper end of the sleeve 14 is coupled to the casing cover 29. The cover 29 is affixed to the outer casing 12 (see FIG. 1) to mount the sleeve 14 within the chamber 10, as well as provide a top enclosure for the chamber 10. Mounting means, such as bolts or screws, are used to mount the cover 29. Once the cover 29 is mounted in place, the chamber 10 is completely enclosed for processing the wafer. As shown, the cover 29 has a central opening 22 that corresponds with the open upper end of the sleeve 14. An anode electrode assembly with its accompanying shaft are inserted into position through the opening in the cover 29 to allow the anode to reside within the interior of the sleeve 14.

An anode electrode assembly (also referred to simply as the anode assembly) extends through opening 22 and is made to reside within the containment region 42. The height of the anode (not shown) above the wafer 15 residing on the wafer support 16 is dependent on the electrical parameters and the process being performed. Typically, for electroplating/electropolishing processes, it is desirable to immerse the anode within the electrolyte. Accordingly, it is desirable to position the anode below the overflow openings 40 so that the anode is immersed in the electrolyte.

In the preferred embodiment, the anode assembly opening 22 not only positions the anode in place, but also provides a conduit for introducing a processing fluid into the containment region 42 of the sleeve 14, as shown by flow arrows 17. The anode assembly opening 22 allows one or more fluids to be piped into the containment region 42 of the sleeve 14. Typically, the processing fluid 17 is introduced into the bounded containment region 42 below the anode. This injection location of the processing fluid into the sleeve 14 ensures a presence of fresh processing fluid proximal to the wafer surface. It is understood that introduction of the processing fluids may also be obtained through one or more conduits coupled to the side of inner sleeve 14, depending on the processing requirements.

Fluid Containment Ring

In the preferred embodiment, a fluid containment ring 26 is also attached to the casing cover 29 by mounting means, such as bolts or screws. The size and shape of the fluid containment ring 26 is a design choice depending on the shape of the inner sleeve 14, but generally the shape is cylindrical to conform to the shape of a cylindrical sleeve 14. The fluid containment ring 26 can be constructed by the use of the same various materials known for constructing liquid acid processing chambers in general, and will typically be made of an inert plastic, such as polypropylene, Teflon, etc.

Figure 4:
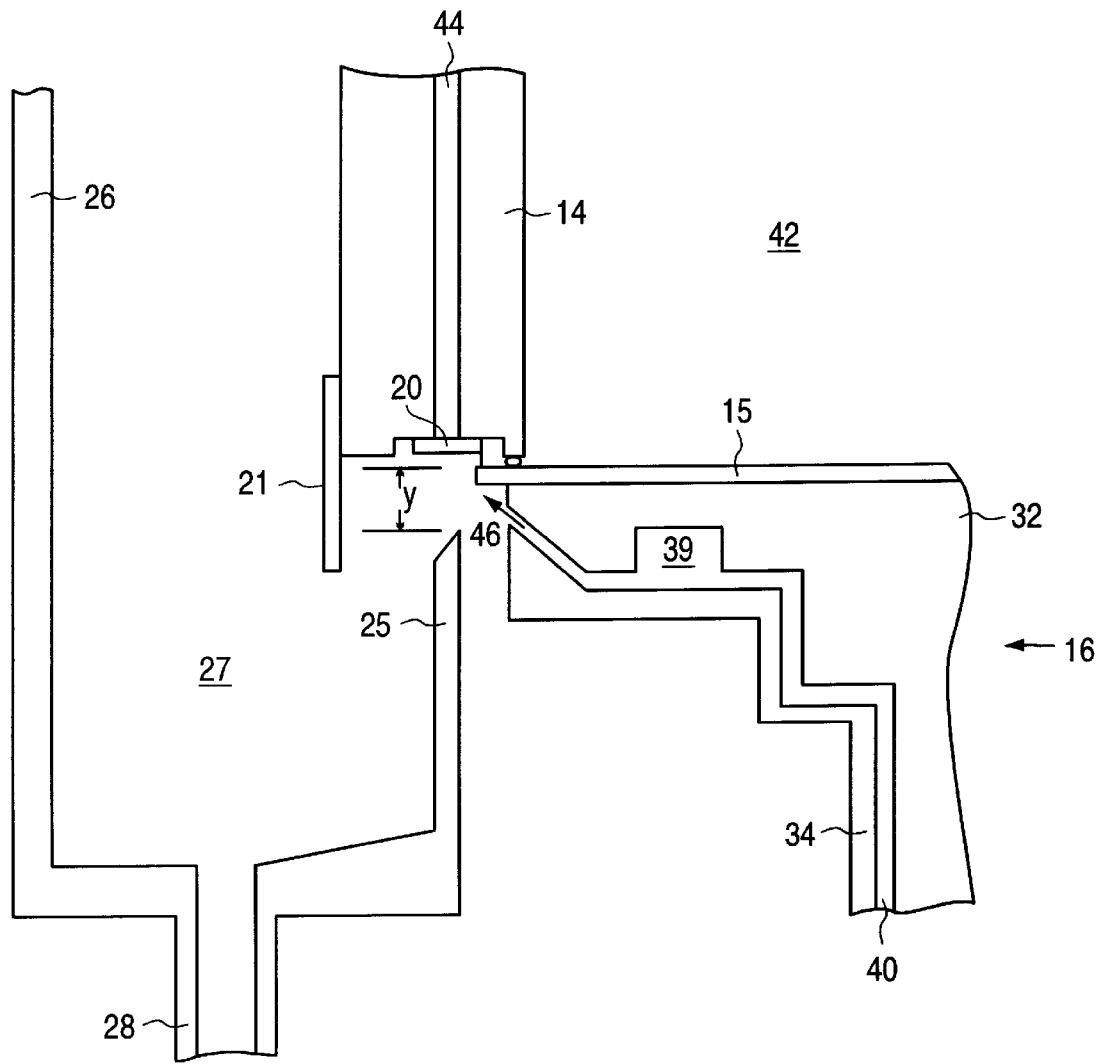
FIG. 4 is a cross-sectional view of the interface between the fluid containment ring, the inner sleeve, and the wafer support, while the wafer is engaged with the lower end of the inner sleeve to form a containment chamber as shown in FIG. 3.

FIG. 4 shows a cross-sectional view of the interface between the fluid containment ring 26, the inner sleeve 14, and the wafer support 16, while the wafer support 16 and wafer 15 are engaged with the inner sleeve 14. The fluid containment ring 26 has a lower lip 25 that forms the inner wall of the containment area 27 which restrains and guides the used processing fluid diverted into the fluid containment ring 26. The depth of the containment area 27 is a design choice depending on the amount of processing fluid used in each processing step, and the rate the processing fluid is drained from the containment area 27. The distance Y between the lip 25 of the fluid containment ring 26 and the base of the sleeve 14 is a design choice. In the preferred embodiment, however, the spacing between the base of the inner sleeve 14 and the lip 25 of the fluid containment ring 26 is typically 6 mm.

During processing (while the wafer support 16 and wafer 15 are engaged with the inner sleeve 14), new processing fluid 17 (see FIG. 2) is introduced into the primary containment chamber 42 to ensure a fresh supply of the processing fluid 17. In the p referred embodiment, as the level of the processing fluid 17 rises within the containment chamber 42, the overflow is discharged through the openings 40 (see FIG. 2) and into the fluid containment ring 26. Fluid guides 21 may be coupled to the outside lower end of the fluid sleeve 14. The fluid guide 21 directs the fluid into the fluid containment ring 26 between the inner sleeve 14 and the lip 25 of the fluid containment ring 26, thereby preventing splashing, etc. Thus, the processing fluid 17 entering the containment area 27 from the overflow openings 40 will be restrained and thereby prevented from exiting the containment area 27 through the opening between the inner sleeve 14 and the lip 25 of the fluid containment ring 26.

Figure 5:
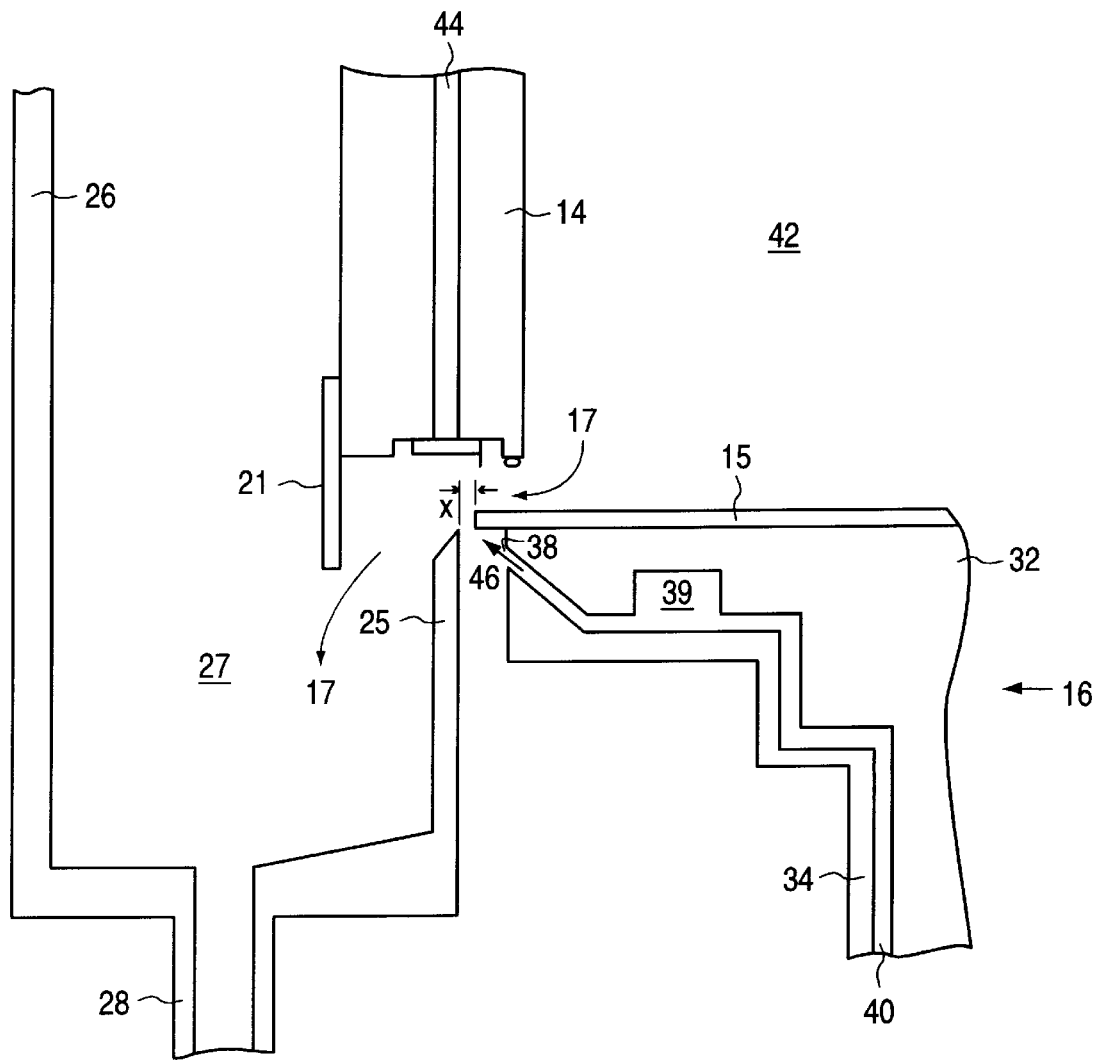
FIG. 5 is a cross-sectional view of the interface between the fluid containment ring, the inner sleeve, and the wafer support, with the wafer support and wafer positioned such that the spent processing fluid is diverted from the containment chamber into the fluid containment ring.

Once the application of the processing fluid has been completed, the support 16, and the wafer 15 residing thereon are lowered to allow the used processing fluid to drain from the containment chamber 42. FIG. 5 shows the wafer support 16 and wafer 15 disengaged from the sleeve 14 with the used processing fluid 17 diverted from the containment chamber 42 into the fluid containment ring 26. The angled holes or slots 38 housed in the wafer support 16 deliver a constant gas flow 46 to direct the processing fluid 17 into the fluid containment ring 26. The inner lip 25 of the fluid containment ring 26 has an inner diameter bigger than the wafer outer diameter (or bigger than the wafer support 16 outer diameter if the wafer edge does not extend past the wafer support 16 —see FIG. 3B) to allow vertical passage of the wafer 15 through the inner diameter of the fluid containment ring 26. The gap X between the fluid containment ring 26 and the wafer outer diameter is a design choice partially based on the requirement of transferring liquid from the wafer 15 into the fluid containment ring 26 through wafer spin and/or the gas flow assist. Optimizing such transfer will also involve vertical positioning of the wafer 15 versus the fluid containment ring inner lip 25, with the lip 25 usually being in a slightly lower position. The gap X allows the wafer 15 to be readily positioned at a transfer position height required by a robotic interface, by moving through the fluid containment ring 26 center opening.

In the preferred embodiment, the distance X from the outer wafer edge to the lip 25 of the fluid containment ring 26 is typically 2 mm. The gas flow 46 deflects the processing fluid 17 over the gap and into the fluid containment ring 26. Note that the angled holes or slots 38 may deliver a constant gas flow 46 to the back of the wafer 15, even when the wafer 15 is engaged with the sleeve 14 and is being processed. In this manner, the gas flow 46 may divert any leakage from the containment chamber 42 during processing into the fluid containment ring 26.

In addition to the use of the angled holes or slots 38 and the gas flow 46 to divert the used processing fluid 17 from the containment chamber 42 into the fluid containment ring 26, rotational movement of the wafer support 16 and wafer 15 may be used to divert the used processing fluid 17 into the fluid containment ring 26. Rotational movement of the wafer support 16 will impart an outward velocity to the used processing fluid 17 and result in the used processing fluid 17 being diverted into the fluid containment ring 26. Rotational movement of the support 16 may also be used to improve uniformity in the processing of the wafer 15, depending on the process optimization method used.

Once the processing fluid 17 has been diverted into the fluid containment ring 26, the containment chamber 27 may be used for containment, disposal, and/or recirculation of the spent processing fluid. The bottom of the fluid containment ring 26 may be slanted toward one or more drains 28 that transfer the used processing fluid 17 as needed. The drains 28 may transfer the used processing fluid 17 for disposal, may transfer the processing fluid 17 into a separate storage container, or may recycle the processing fluid 17 for reuse in the primary containment chamber 42. Typically, if the processing fluid 17 is recycled for reuse, the processing fluid 17 will be filtered and reconditioned before being re-injected into the primary containment chamber 42. Recirculation and reuse of the processing fluid 17 reduces the liquid volume usage requirements for the processing of the wafer 15.

Processing Module/Housing

Figure 6:
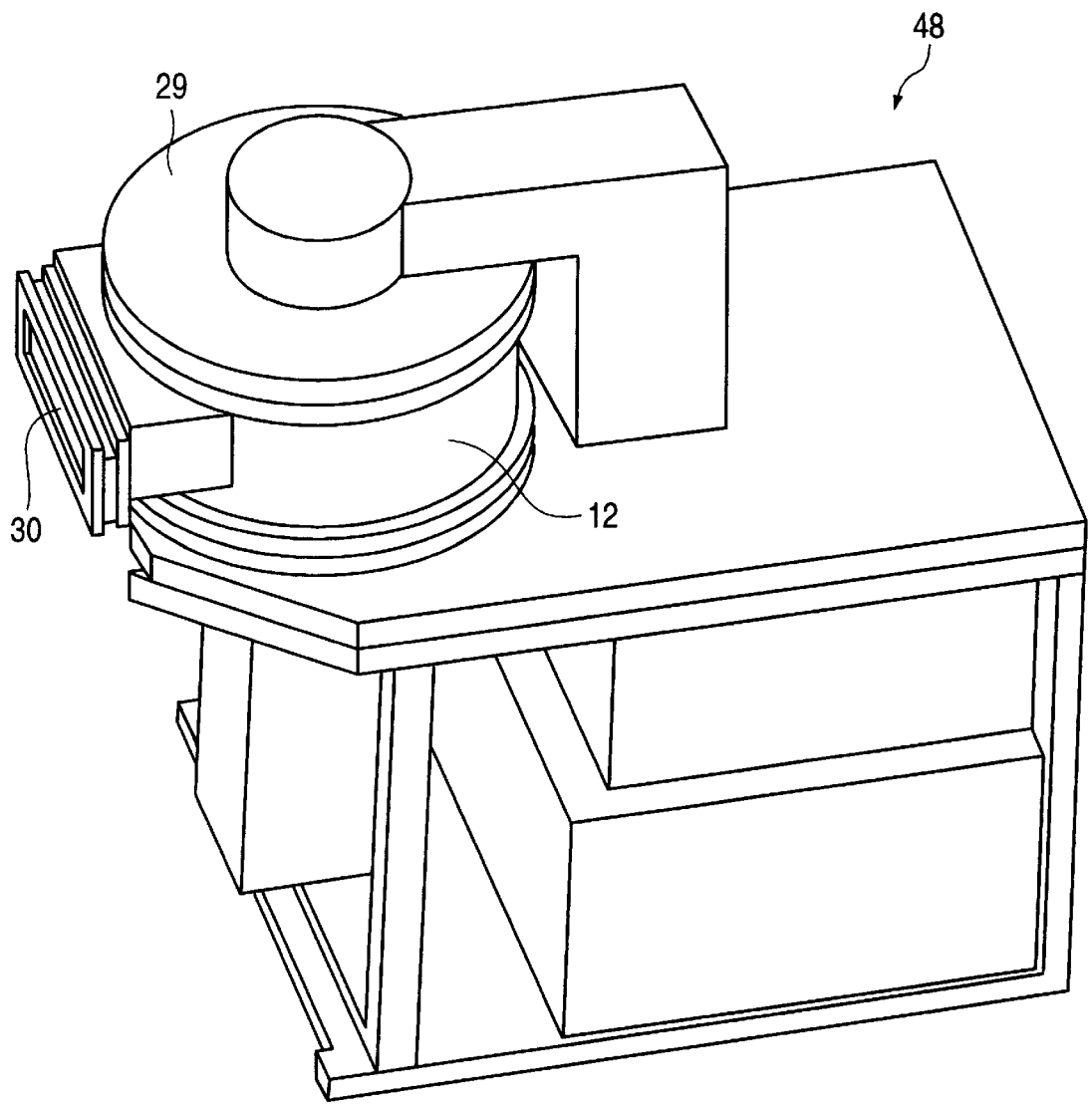
FIG. 6 is a pictorial illustration of a processing module used to house a processing chamber.

The processing module 48 houses the processing chamber 10 therein. A pictorial illustration of the processing module 48 is shown in FIG. 6. The processing module (or housing) 48 is a modular unit designed to house the processing chamber 10 and its associated mechanical and electrical components, such as electrical wiring, fluid distribution piping, couplings to external system components, and mechanisms for rotating/oscillating and raising/lowering internal components of the processing chamber 10. The processing chemical (or electrolyte), de-ionized (DI) water, nitrogen and vacuum connections are made to the module 48 for distribution to the processing chamber 10. One or more drains 28 (see FIG. 2) from the processing chamber 10 are coupled to a container for containing the electrolyte or to a waste treatment component of the system. It is appreciated that the delivery and removal of such chemicals and fluids to/from a processing chamber are known in the art. Thus, module 48 is but one example of how the processing chamber 10 and its external components may be configured.

Advantages

The use of a fluid containment ring of the present invent coupled to a processing chamber provides advantages over the prior art. Because used processing fluid 17 drains into the fluid containment ring 26 rather than flowing downward over the edges of the processed wafer 15, the back of the wafer 15 is not exposed to the processing fluid 17. The use of a gas flow 46 while processing the wafer 15 and draining the used fluid 17 from the processing containment chamber 42 further diverts any processing fluid 17 from reaching the back side of a wafer 15. The present invention also allows the separation of the various processing fluids used to process the wafer, which allows separate consecutive processes to be applied within the same process chamber. By allowing each processing fluid to be drained from the containment ring of the present invention into a different storage area, the present invention provides an improved control over impurities and particles left within the processing fluid and allows the processing fluids to be more easily filtered and recycled/reused.

A processing chamber using a fluid containment ring for the disposal of the used processing fluid also allows the possibility of combining several such chambers to serve as processing stations within a multiple station processing chamber. Each processing station could then have independent fluid injection and disposal systems or devices. By designating a particular processing fluid to each processing station, the processing fluids could be recycled more easily since they would not have been co-mingled or exposed to other processing fluids. By housing multiple processing stations within a single containment chamber, a wafer can undergo several processing steps without ever having to be reloaded in a second chamber. Thus, the wafer is not exposed to the ambient during transfer between chambers. Additionally, a single chamber allowing multiple processing steps saves money previously spent on duplicative equipment and saves a significant amount of time during processing previously spent transferring wafers from chamber to chamber.

Multiple Station Processing Chamber

The present invention describes a multiple station processing chamber used to deposit and/or remove a material on a semiconductor wafer. The multiple station processing chamber is comprised of two or more processing stations at which the wafer is exposed to a processing fluid. The processing stations are positioned within the chamber such that the wafer may be moved from station to station while remaining within the chamber. A multiple station processing chamber allows multiple processing steps to be applied to a wafer at different stations within a single chamber. By allowing multiple processes to occur within a single chamber, the wafer is not exposed to ambient conditions while being moved from process to process. Instead, the wafer remains at the desired pressure, temperature, etc. required for optimum results in processing the wafer. Further, because each processing fluid is applied at a different processing station, each processing fluid may be recycled and reused without contamination by traces of other processing fluids.

The type of processing stations used within the multiple processing chamber may vary, depending on the desired number of stations, the processing fluids to be applied at each processing station, etc. Each processing station may be independent of the others, having its own respective inlet for applying the processing fluid of that station and its own draining system for disposal or recirculation of the used processing fluid. For example, processing chambers such as the one described above may be coupled together and housed within a single casing to form a multiple station processing chamber. In the preferred embodiment, the above described chamber and containment ring is modified to allow multiple stations to be stacked within a containment chamber. The wafer support may then raise and/or lower the wafer from station to station for processing.

Figure 7:
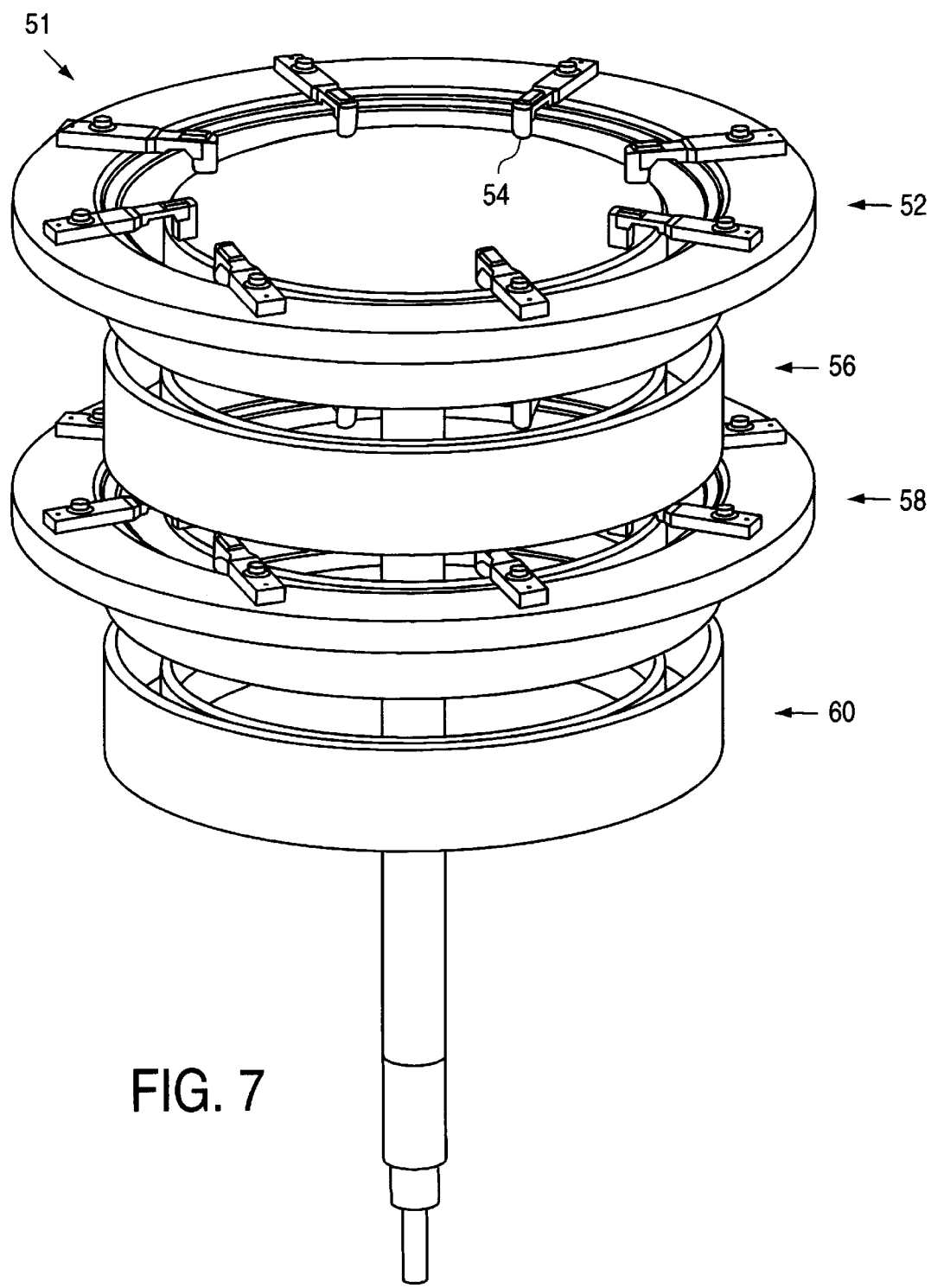
FIG. 7 is an isometric view of a multiple station processing chamber.
Figure 8:
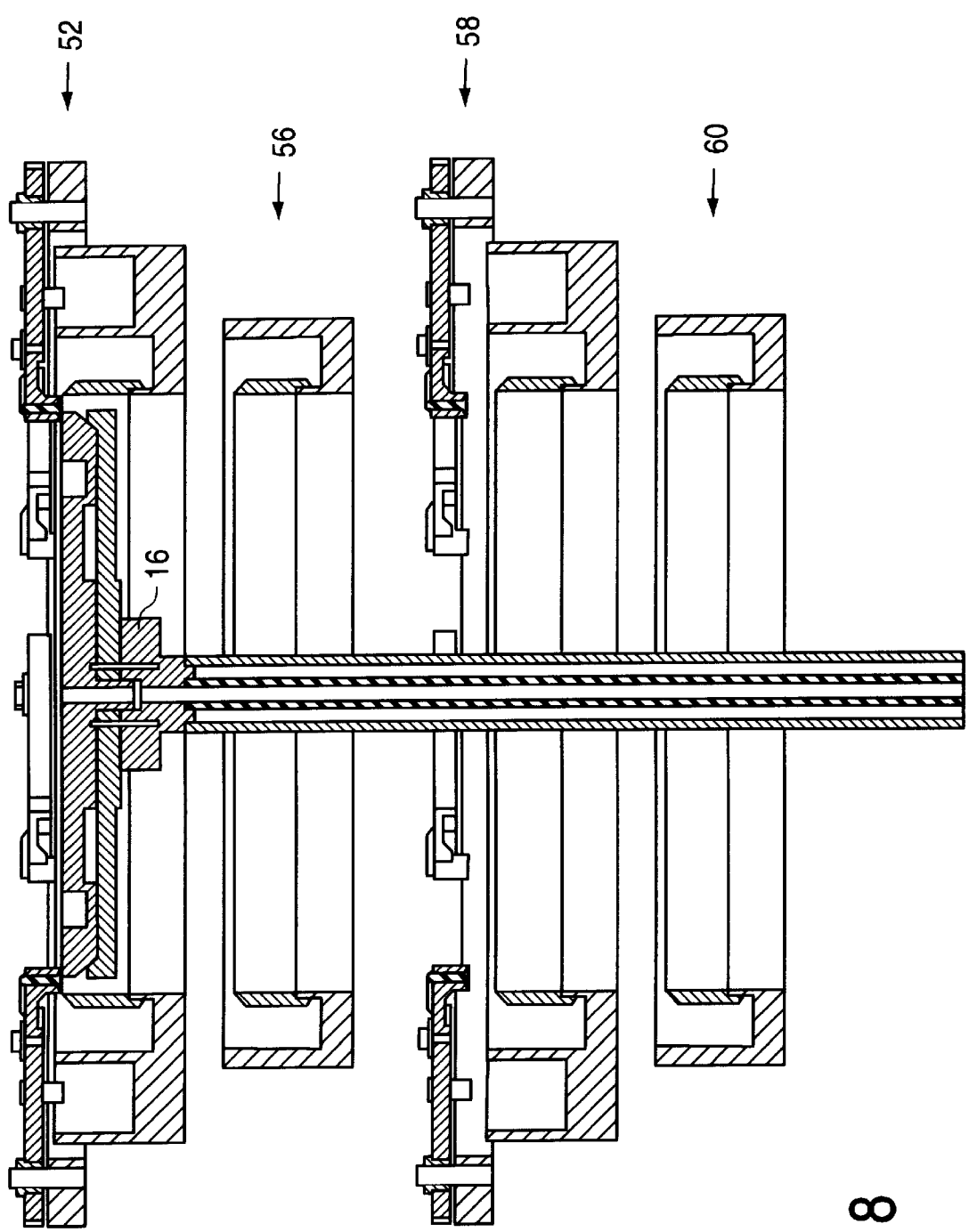
FIG. 8 is cross-sectional view of the multiple station processing chamber shown in FIG. 7.

An isometric view of a four station processing chamber 51 of the present invention is shown in FIG. 7 with a corresponding cross-sectional view shown in FIG. 8. Note that the fluid injection assemblies, the anodes, and the drains at each station are not shown, nor is the outer casing of the chamber. The processing stations are assembled onto a bracket/housing. The cathode, anode, fluid dispense mechanisms or assemblies, etc. can also be coupled to the same bracket/assembly. The bracket/assembly with the assembled processing stations and cathode, anode, and fluid dispense mechanisms then mount within the containment chamber 51 and are housed within a processing module 48, such as the one shown in FIG. 6.

The first (top) station 52 of the multiple station processing chamber 52 is a processing station in which a processing fluid will be applied to the face of the wafer and multiple cathodes 54 will contact the wafer along the unprocessed periphery of the wafer such that an electric field is created and electropolishing or electroplating occurs. Once the first processing step has been completed, the wafer support 16 will lower the wafer to station two 56. Station two 56 is a rinsing station in which de-ionized (DI) water is applied to the face of the wafer to wash it. Station two does not have electrodes since no electric field needs to be applied to the wafer at this station. The wafer support 16 will then lower the wafer to station three 58. Station three 58 is another processing station in which a processing fluid will be applied to the face of the wafer, with an electric field created by station three's anodes and cathodes if required. Once step three is completed, the wafer support 16 and wafer will be lowered to station four 60. As shown, station four 60 may be a second rinsing station. Again, no electric field needs to be applied and thus station four 60 does not have its own electrodes. Alternatively, nitrogen ($N_2$) gas may be pumped into station four 60 to dry the wafer prior to its removal from the chamber 51.

It is appreciated that the wafer may be treated by multiple processing fluids and may be cleaned and dried a number of times throughout the processing of the wafer, including prior to the introduction of a processing fluid. The number of stations and the order of processing treatment and cleaning steps shown in FIGS. 7 and 8 are illustrative only. Further, note that the wafer support 16 may carry the wafer to the processing stations in any order, thus allowing certain processing steps to be repeated or skipped as needed.

Wafer Support

A wafer is loaded through an access port 30 (as shown in FIG. 6) into the multiple station process chamber 51 in the same manner as described above with the single processing chamber 10. Likewise, the wafer support 16 used with the multiple station processing chamber 51 of the present invention is the same as the one described above for use with the single processing chamber 10. The wafer support 16 is shown in detail in FIGS. 3A and 3B (see above discussion).

Processing Station

Figure 9:
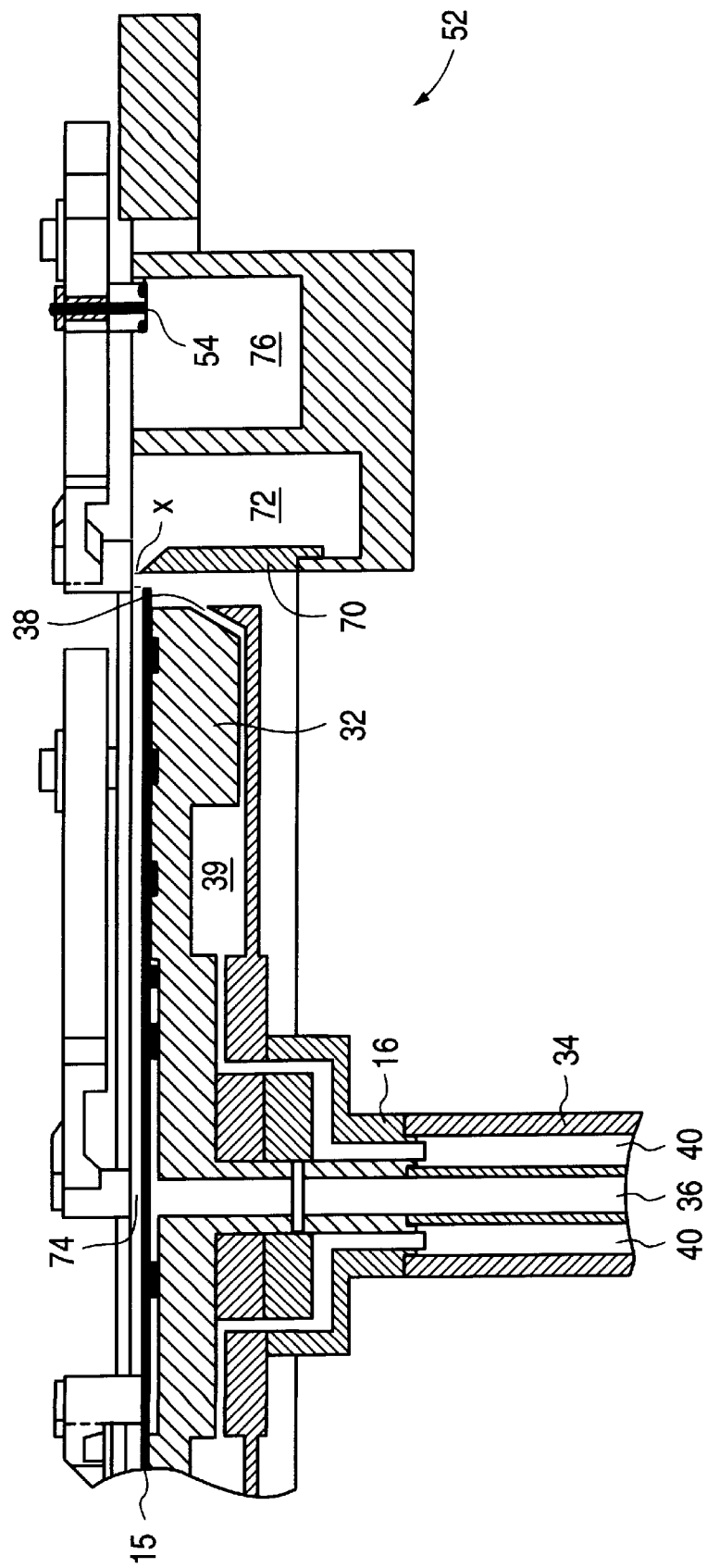
FIG. 9 is a cross-sectional view of the first processing station of the multiple station processing chamber of FIGS. 7 and 8.
Figure 10:
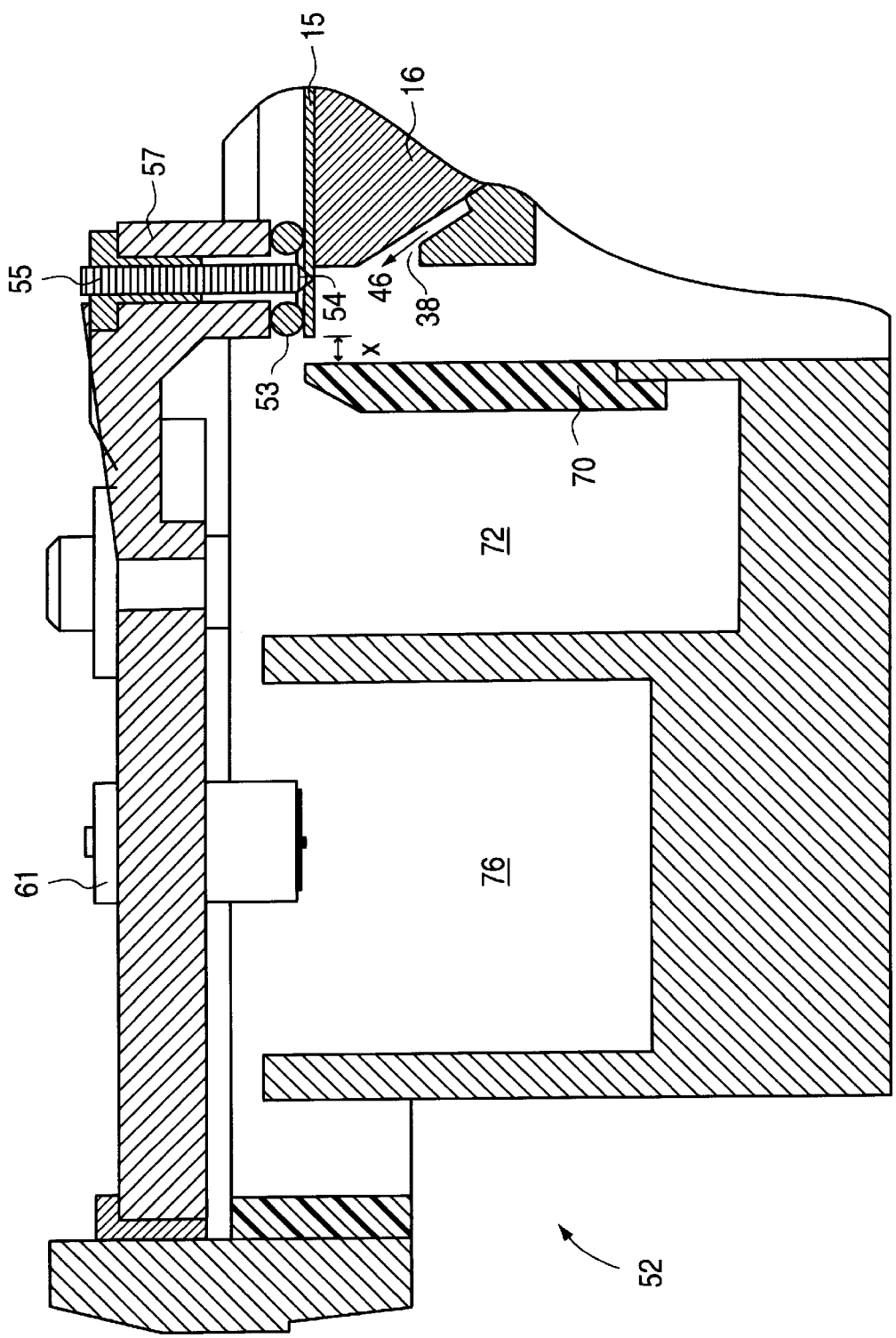
FIG. 10 is a cross-sectional view of the fluid containment ring of the present invention with a cathode rotatably attached thereto.

Once a wafer 15 is loaded onto the wafer support 16, the wafer support 16 will move the wafer 15 from station to station. In the preferred embodiment, the processing stations are vertically stacked and the wafer 15 and wafer support 16 pass through the interior of each processing station when moving from station to station. Multiple stacks of stations can be envisioned, all housed within one containment chamber. A preferred embodiment of a processing station 52 for use in the multiple station processing chamber 51 of the present invention is shown in FIG. 9. FIG. 10 is a cross-sectional view of the interface between the preferred processing station 52, the wafer 15, and the wafer support 16.

Unlike the above described single processing chamber 10 with fluid containment ring 26, the processing station 52 as used in the multiple processing station chamber 51 does not have an inner sleeve to which the wafer 15 mates to form the base of a containment chamber. Instead, when the wafer 15 is positioned for processing, the periphery of the wafer 15 is in near proximity to the fluid containment ring 70. A fluid injection assembly (or fluid input assembly) centrally located (but not shown in FIG. 9) above the wafer 15 will apply a first processing fluid to the wafer 15. The processing fluid will be injected into processing area 74 and will flow over the face of the wafer 15 and toward the outer edges of the wafer 15 as more fluid is applied. The excess fluid will flow off the outer edges of the wafer 15 and be directed into the containment ring section 72 of the fluid containment ring 70 by the gas flow 46 from the angled holes or slots 38 directed at the back (unprocessed) side of the wafer 15. Thus, as discussed above with single processing chamber 10, the gas flow 46 prevents the processing fluid from falling through the slight gap X between the outer edge of the wafer 15 and the fluid containment ring 70. Note that the gap X is typically 2 mm, but this distance may vary as long as the wafer 15 clears the containment ring 70 (see above discussion with single processing chamber 10). One or more drains (not shown) at the base of the fluid containment ring 70 will then transport the processing fluid from the containment ring section 72 for storage, disposal, or reuse.

Fluid Input Assembly

Each processing station may have its own fluid input assembly rotatably positioned and/or coupled to the station's fluid containment ring 70 such that the fluid input assembly may be moved to the side, out of the path of the wafer 15, when the wafer 15 moves from station to station. A shaft provides a conduit for introducing a processing fluid into the processing region 74 above the wafer 15. Depending on the process involved, the processing fluids may be an electrolyte for electroplating, an electrolyte for electropolishing, de-ionized (DI) water for rinsing, nitrogen ($N_2$) for drying, etc. Thus, liquid input and/or gas input assemblies may be sized and shaped as required for specific flow and pressure needs, as well as spaced away from the wafer surface as required by a specific process requirement.

An anode electrode may also be attached (by means such as a bolt, screw, clamp, or solder) to the end of the fluid input shaft such that it resides within the processing region 74 during processing of the wafer 15. As with the single processing chamber 10 discussed previously, the height of the anode above the wafer 15 is dependent on the electrical parameters and the process being performed. Although the preferred embodiment has the anode coupled to the fluid input shaft, note that the anode may be coupled to the fluid containment ring 70 independent of the fluid input shaft. If coupled to the fluid containment ring 70 independent of the fluid input shaft, the anode and its corresponding shaft will also have to be rotatably coupled to the fluid containment ring 70 such that the anode and its shaft might be moved to the side to allow the wafer 15 and wafer support 16 to pass through the processing station 52 without interference.

Cathode Electrodes

As with the single processing chamber 10 discussed above, in the multiple station processing chamber 51, the cathode electrodes 54 will still couple and/or position to the surface of the wafer 15 exposed to the processing fluid along the periphery of the wafer 15. As with the fluid input assembly and the anode(s), however, the cathodes 54 must be rotatably coupled/positioned to the fluid containment ring 70. The cathodes 54 must be able to move to the side when the wafer 15 and wafer support 16 are being repositioned at a different processing station and then move back into position to couple with the surface of the wafer 15 during the processing of the wafer 15 at that particular processing station.

Figure 11:
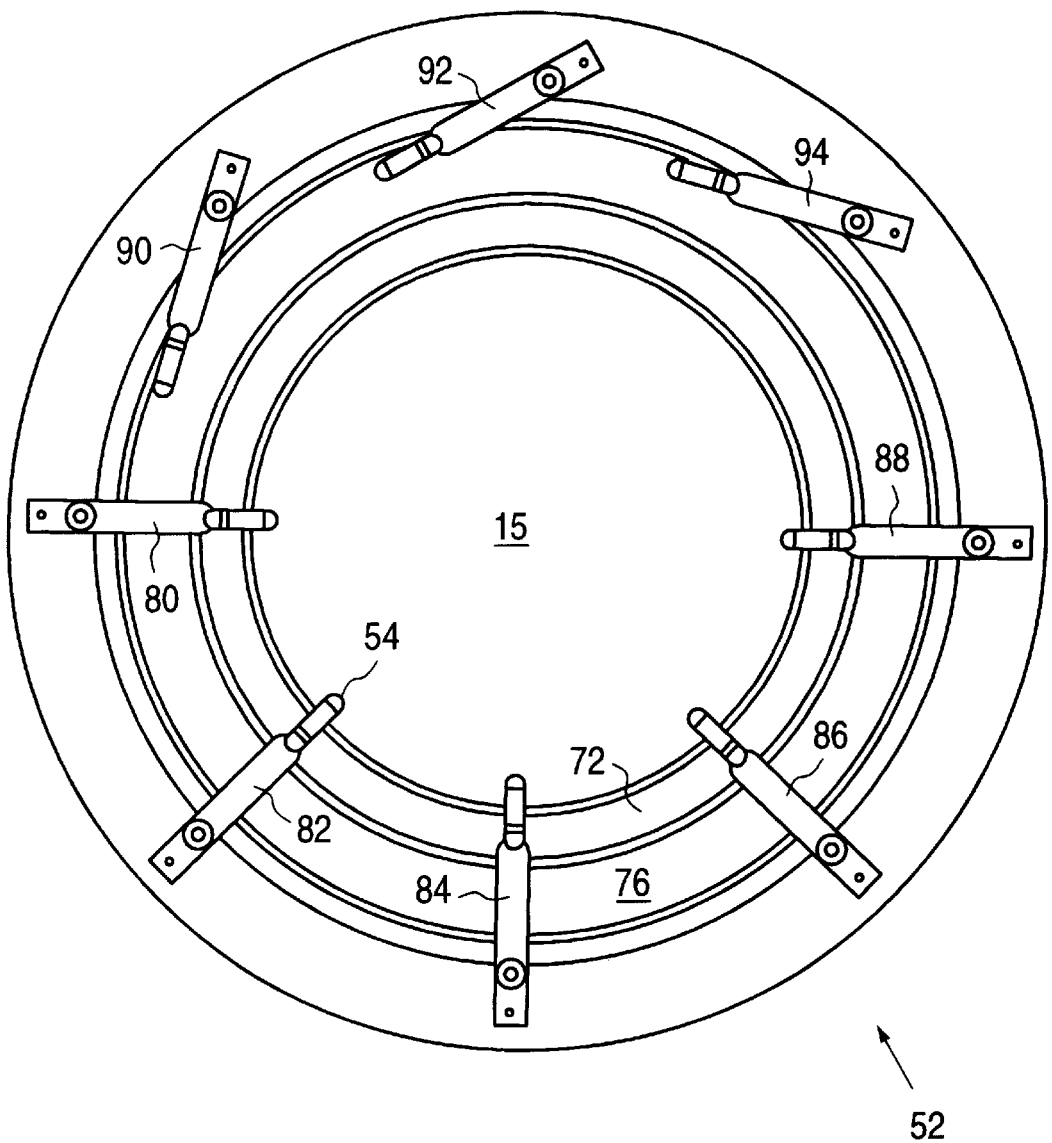
FIG. 11 is a top view of a processing station of the multiple station processing chamber of FIGS. 7 and 8.

FIG. 10 is a cross-sectional view of the interface between the preferred processing station 52 and the wafer 15 showing the cathode electrode 54 in contact with the edge of the wafer 15 (the processing position). The cathodes 54 and electrical connectors 55 housed in a shaft 57 are rotatably coupled/positioned to the fluid containment ring 70. Position 61 (the at rest/rinsing position—shown in FIG. 9) is where the cathode 54 and shaft 57 remain when wafer 15 is not being processed at station 52. FIG. 11 provides a top view of the processing station 52 with eight cathodes. Cathode assemblies 80, 82, 84, 86, and 88 are positioned/coupled to the wafer and are ready for processing, while cathode assemblies 90, 92, and 94 are shown in the at rest/rinsing position.

The coupling and/or positioning of the cathode 54 to the wafer surface during processing follows the same principles as the cathode connections described above in the single processing chamber 10. The shaft 57 houses an electrical connection 55 while shielding the electrical connection from the corrosive effects of the electrolyte. An o-ring seal 53 around the cathodes 54 isolates the cathodes 54 from the electrolyte. Note that each processing station may contain multiple contact locations (or cathodes) associated with the placement of the cathode electrodes 54 on the face of the wafer 15.

After a processing step is completed, traces of the processing fluid may remain on the cathodes 54. Thus, a feature allowing each cathode 54 to be rinsed and/or dried between processing applications would be advantageous. Rinsing and/or drying the cathodes 54 between each processing applications will build up the etching effect. While in the at rest/rinsing position 61, the cathode 54 end of the shaft 57 is directly over the receptacle 76 (also referred to as a containment chamber, rinsing chamber, etc.). A nozzle may be housed within the receptacle 76 to rinse, spray, or immerse the cathode 54 in order to remove any lingering trace of the processing fluid. The receptacle 76 may also apply a gas, such as nitrogen, argon, helium, or CDA, to the cathode 54 to dry the cathode 54 off. In the preferred embodiment, a rinse of deionized water will be sprayed on the cathode 54 and the cathode will then be dried by nitrogen. When the time comes for the processing station 52 to apply a processing fluid to the wafer 15, the clean cathodes 54 are then rotated back into position such that they couple/position with the surface of the wafer 15.

Note that although the processing station 52 of the multiple station processing chamber 51 described above has a rotatably coupled fluid input assembly, anode, and cathodes, it is possible to have a multiple station processing chamber wherein at least one of the stations has a fixed fluid input assembly, anode, and cathodes. For example, the uppermost processing station would not need to clear a path for the wafer and wafer support to pass through since the wafer will not need to ever be positioned above the electrodes and fluid input assembly. Thus, a multiple station processing chamber could use a processing chamber such as the single processing chamber 10 described at the beginning of this discussion for at least one of the processing stations of the chamber.

Thus, a multiple station processing chamber used to deposit and/or remove a material on a semiconductor wafer wherein multiple processing steps are applied to the wafer within a single chamber is described. By allowing the multiple processes to occur within a single chamber, the wafer is not exposed to ambient conditions when being moved from process to process. Instead, the wafer remains at the desired pressure, temperature, etc. required for optimum results in processing the wafer. Further, since each processing fluid is applied at a different processing station, each processing fluid may be recycled and reused without contamination by traces of other processing fluids.

We claim:

1. An apparatus for processing a substrate comprising:

a chamber;

a first processing station inside said chamber wherein said substrate is exposed to a first processing fluid when positioned at said first processing station;

a second processing station coupled to said first processing station and inside said chamber, wherein said substrate is exposed to a second processing fluid when positioned at said second processing station; and, a support for having said substrate reside thereon, said support for positioning said substrate at said first and second processing stations for processing.

2. The apparatus of claim 1 further comprising a first electrode and a second electrode coupled to said first processing station, such that when said substrate is positioned at said first processing station for processing said second electrode couples to said substrate and a potential is applied across said first and second electrodes.

3. The apparatus of claim 2 wherein said second processing fluid is either deionized water for rinsing said substrate or nitrogen gas, argon gas, helium gas, or clean dry air for drying said substrate.

4. The apparatus of claim 3 wherein said first processing fluid is an electrolyte for electroplating said substrate.

5. The apparatus of claim 3 wherein said first processing fluid is an electrolyte for electropolishing said substrate.

6. The apparatus of claim 1 wherein said first processing station comprises:

a first fluid containment ring into which said first processing fluid is diverted after processing said substrate;

a first drain coupled to said first fluid containment ring for draining said first processing fluid from said first fluid containment ring;

a first fluid injection assembly coupled to said first containment ring such that said first fluid injection assembly is located above a substrate support and is adapted to apply said first processing fluid to said substrate when said substrate is positioned at said first processing station;

a first electrode coupled to said first containment ring; and, a second electrode coupled to said first containment ring such that said second electrode couples to said substrate when said substrate is positioned at said first processing station.

7. The apparatus of claim 6 wherein said second processing chamber comprises:

a second fluid containment ring for receiving said second processing fluid after processing said substrate;

a second drain coupled to said second fluid containment ring for draining said second processing fluid from said second fluid containment ring; and, a second fluid injection assembly rotatably coupled to said second fluid containment ring such that when said support has positioned said substrate at said second processing station for processing, said second fluid injection assembly rotates into position at a location above said substrate and applies a second processing fluid to said substrate.

8. The apparatus of claim 7 further comprising a gas purge line residing within said support, said gas purge line for providing a gas flow that directs said first and second processing fluids into said first and second containment rings and prevents said first and second processing fluids from contacting a surface of said substrate not exposed to said first and second processing fluids during processing of said substrate.

9. The apparatus of claim 8 wherein said support is adapted to rotate or oscillate such that said first and second processing fluids are directed into said first and second fluid containment rings when said substrate is positioned at said first and second processing stations.

10. The apparatus of claim 8 wherein said second processing station further comprises:

a third electrode coupled to said second fluid containment ring;

a fourth electrode rotatably coupled to said second fluid containment ring wherein said at least one fourth electrode is adapted for rotating into position and coupling to said substrate, when said support has positioned said substrate at said second processing station for processing.

11. The apparatus of claim 8 wherein said first containment ring has a first receptacle and said second electrode is rotatably coupled to said first fluid containment ring, wherein said second electrode may be rotated into position above said receptacle such that any of said first processing fluid remaining on said second electrode after processing may be removed by said receptacle.

12. The apparatus of claim 11 wherein said first receptacle is adapted to apply de-ionized water to said second electrode to rinse said second electrode.

13. The apparatus of claim 1, wherein said first and second processing stations are vertically stacked.

14. The apparatus of claim 1, wherein said support passes through a center of said first and second processing stations to position said substrate.

15. An apparatus for processing a substrate comprising:

a chamber;

a support for having said substrate reside thereon;

a first fluid containment ring inside said chamber;

a first fluid injection assembly coupled to said first fluid containment ring, said first fluid injection assembly for applying a first processing fluid to said substrate such that said first processing fluid flows into said first fluid containment ring after processing said substrate;

a first electrode coupled to said first fluid containment ring;

a second electrode coupled to said first containment ring for coupling to said substrate during processing of said substrate;

a second containment ring inside said chamber;

a second fluid injection assembly coupled to said second fluid containment ring, said second fluid injection assembly for applying a second processing fluid to said substrate such that said second processing fluid flows into said second containment ring after processing said substrate.

16. The apparatus of claim 15 further comprising a gas purge line residing within said support, said gas purge line for providing a gas flow that prevents said first and second processing fluids from contacting a surface of said substrate not exposed to said first and second processing fluids during processing of said substrate.

17. The apparatus of claim 16 wherein said support is adapted for rotation or oscillation such that said first and second processing fluids are directed into said first and second containment rings when said substrate is positioned at said first and second containment rings.

18. The apparatus of claim 16 further comprising a first drain coupled to said first containment ring for draining said first processing fluid from said first containment ring and a second drain coupled to said second containment ring for draining said second processing fluid from said second containment ring.

19. The apparatus of claim 16 wherein said first fluid containment ring has a first receptacle and said second electrode is rotatably coupled to said first containment ring, wherein said second electrode may be rotated into position above said receptacle such that any of said first processing fluid remaining on said second electrode after processing may be removed by said receptacle.

20. The apparatus of claim 19 wherein said first receptacle is adapted to apply de-ionized water to said at least one second electrode to rinse said at least one second electrode.

21. The apparatus of claim 15, wherein said first and second containment rings are vertically stacked.

22. The apparatus of claim 15, wherein said support passes through a center of said first and second containment rings to position said substrate.

* * * * *